United States Patent
Wang et al.

(10) Patent No.: US 10,403,970 B2
(45) Date of Patent: Sep. 3, 2019

(54) CHIP ANTENNA, ELECTRONIC COMPONENT, AND METHOD FOR PRODUCING SAME

(71) Applicant: IHP GmbH—Innovations for High Performance Microelectronics/Leibniz-Institut Fur Innovative Mikroelecktronik, Frankfurt (Oder) (DE)

(72) Inventors: Ruoyu Wang, Frankfurt (DE); Yaoming Sun, Frankfurt (DE); Johann Christoph Scheytt, Dorsten (DE); Mehmet Kaynak, Frankfurt (DE)

(73) Assignee: IHP GMBH-INNOVATIONS FOR HIGH PERFORMANCE MICROELECTRONICS/LEIBNIZ-INSTITUT FUR INNOVATIVE MIKROELEKTRONIK (DE)

( * ) Notice: Subject to any disclaimer, the term of this patent is extended or adjusted under 35 U.S.C. 154(b) by 808 days.

(21) Appl. No.: 14/656,000

(22) PCT Filed: Dec. 23, 2013

(86) PCT No.: PCT/EP2013/077951
§ 371 (c)(1),
(2) Date: Oct. 9, 2015

(87) PCT Pub. No.: WO2014/102260
PCT Pub. Date: Jul. 3, 2014

(65) Prior Publication Data
US 2016/0072182 A1   Mar. 10, 2016

(30) Foreign Application Priority Data
Dec. 27, 2012 (DE) .......................... 10 2012 224 458
Apr. 29, 2013 (DE) .......................... 10 2013 207 829

(51) Int. Cl.
*H01Q 1/38* (2006.01)
*H01L 23/66* (2006.01)
(Continued)

(52) U.S. Cl.
CPC ........... *H01Q 1/38* (2013.01); *H01L 23/5227* (2013.01); *H01L 23/66* (2013.01); *H01Q 1/2283* (2013.01);
(Continued)

(58) Field of Classification Search
CPC ....... H01L 23/5227; H01L 23/66; H01Q 1/42; H01Q 19/10; H01Q 21/0093; H01Q 21/062; H01Q 1/2283; H01Q 1/38
See application file for complete search history.

(56) References Cited

U.S. PATENT DOCUMENTS 5,539,241 A * 7/1996 Abidi .................... H01L 23/645
257/516
7,943,404 B2  5/2011 Ding
(Continued)

OTHER PUBLICATIONS

"A 94 GHz Aperture-Coupled Micromachined Microstrip Antenna" by Gildas P. Gauthier et al, Microwave Symposium Digest, 1998 IEEE MTT-S International Baltimore, MD, USA Jun. 7, 1998, New York, NY, USA, pp. 993-996.
(Continued)

*Primary Examiner* — Graham P Smith
*Assistant Examiner* — Jae K Kim
(74) *Attorney, Agent, or Firm* — Ware, Fressola, Maguire & Barber LLP

(57) ABSTRACT

A chip antenna comprising at least one emitter which extends parallel to a main surface of a semiconductor substrate supporting the chip antenna, wherein the emitter is arranged on an island-like support zone of the semiconductor substrate, the support zone being surrounded by at least
(Continued)

one trench which is completely filled with a gas, the trench passing through the entire depth of the semiconductor substrate and being bridged by at least one retaining web which forms a supporting connection between the support zone and the rest of the semiconductor substrate.

15 Claims, 3 Drawing Sheets

(51) Int. Cl.
- *H01Q 1/22* (2006.01)
- *H01Q 1/42* (2006.01)
- *H01Q 19/10* (2006.01)
- *H01Q 21/00* (2006.01)
- *H01Q 21/06* (2006.01)
- *H01L 23/522* (2006.01)

(52) U.S. Cl.
CPC ............... *H01Q 1/42* (2013.01); *H01Q 19/10* (2013.01); *H01Q 21/0093* (2013.01); *H01Q 21/062* (2013.01); *H01L 2223/6677* (2013.01); *H01L 2924/0002* (2013.01)

(56) References Cited

U.S. PATENT DOCUMENTS

| | | | |
|---|---|---|---|
| 2002/0127814 A1* | 9/2002 | Kubo | H01L 29/0804 438/365 |
| 2003/0127704 A1* | 7/2003 | Kobayashi | H01F 17/0006 257/531 |
| 2008/0001262 A1 | 1/2008 | Kamgaing | |
| 2008/0068269 A1 | 3/2008 | Yamada | |
| 2008/0265373 A1* | 10/2008 | Nozawa | H01L 29/66174 257/595 |
| 2009/0085133 A1 | 4/2009 | Doan | |
| 2010/0032796 A1 | 2/2010 | Brown et al. | |
| 2010/0276729 A1* | 11/2010 | Aoi | H01L 29/0834 257/139 |
| 2013/0161688 A1* | 6/2013 | Seo | H01L 29/7395 257/139 |
| 2013/0313682 A1* | 11/2013 | Jebory | H01L 23/481 257/544 |
| 2015/0155273 A1* | 6/2015 | Nakajima | H01L 29/41725 257/76 |
| 2015/0173658 A1* | 6/2015 | Liu | A61B 5/14507 600/348 |

OTHER PUBLICATIONS

"Micromachined Loop Antennas on Low Resistivity Silicon Substrates" by Erik Ojefors, et al, IEEE Transactions on Antennas and Propagation, IEEE Service Center, Piscataway, NJ, US Bd. 54, Nr. 12, 1 Dec. 2006, pp. 3593-3601.

A Micromachined Double-Dipole Antenna for 122-140 GHZ Applications Based on a SiGe BiCmOS Technology, by Ruoyu Wang, et al, Microwave Symposium Digest (MTT), 2012, whole document (3 pages) Jun. 17, 2012.

* cited by examiner

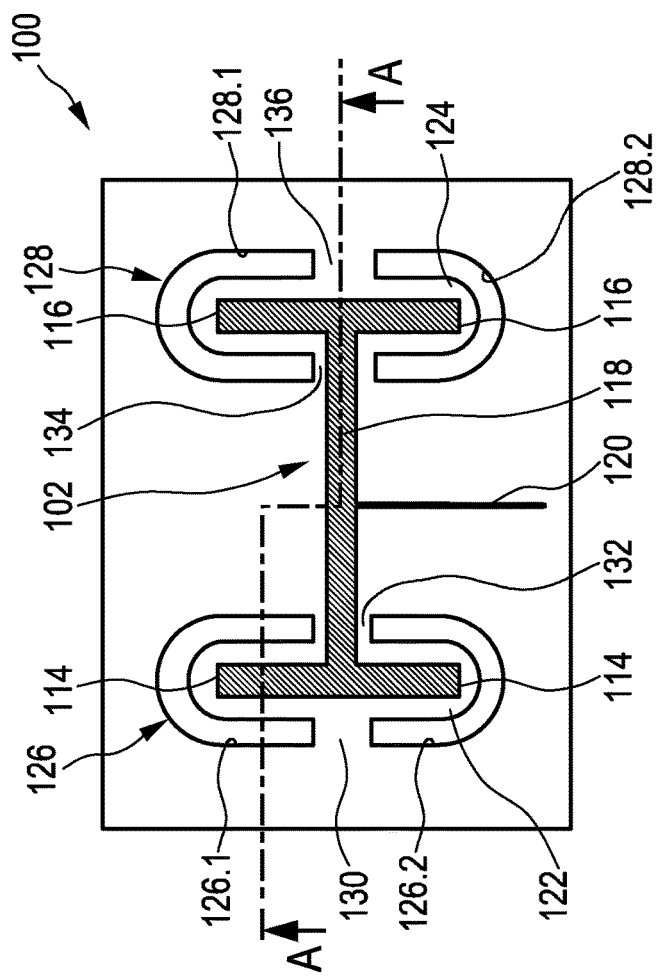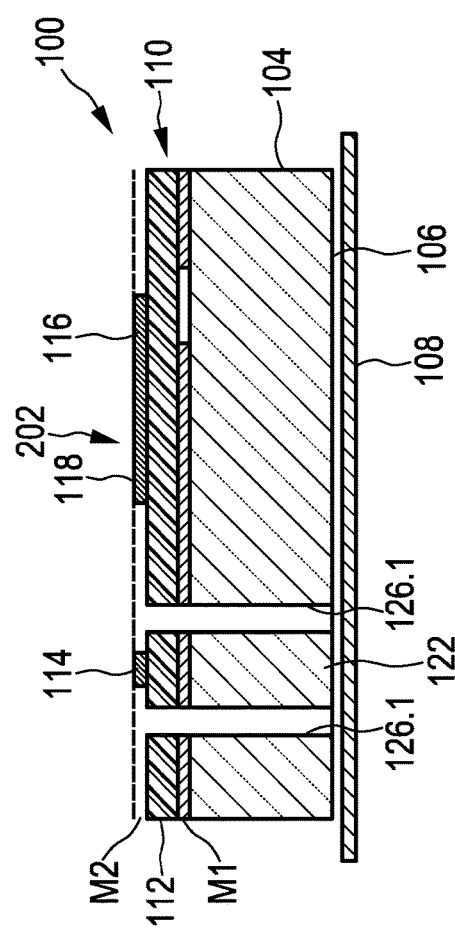

CHIP ANTENNA, ELECTRONIC COMPONENT, AND METHOD FOR PRODUCING SAME

CROSS REFERENCE TO RELATED APPLICATIONS

This application is the U.S. National Stage of International Application Number PCT/EP2013/077951 filed on Dec. 23, 2013, which application claims priority under 35 USC § 119 to German Patent Application No. 10 2012 224 458.1 filed on Dec. 27, 2012 and German Patent Application No. 10 2013 207829.3 filed on Apr. 29, 2013, which applications are hereby incorporated by reference in their entirety.

TECHNICAL FIELD

The invention relates to a chip antenna, an electronic component having a chip antenna, and a method for producing such a chip antenna.

BACKGROUND OF THE INVENTION

Such chip antennas are also referred to as on-chip antennas. They are used, in particular, in wireless transmission systems that operate with millimeter waves up to the a terahertz range. An increasing number of applications can be found in the fields of radar, fast data transfer, imaging systems and sensors.

At the extremely high frequencies referred to above, electronics packaging technologies are more difficult and cost-intensive in comparison with antennas for lower frequencies. On the other hand, it is possible to integrate the antenna directly into the transceiver chip within a very small space and thus to simplify the packaging, because the wavelengths of the electromagnetic waves to be transmitted or received are shorter, which means that the antennas are small enough for on-chip integration.

One problem when embodying chip antennas is that silicon, which is used as a substrate in standard CMOS and BiCMOS processes, is a relatively poor support for antenna structures. The electrical impedance of silicon is relatively low, with signal losses ensuing as a result. In addition to that, the permittivity of silicon is relatively high, thus favoring the propagation of waves through the substrate. This causes the substrate to heat up, with scatter radiation being produced at the edges of the substrate. All this reduces the efficiency of chip antennas integrated on silicon substrates. Furthermore, when integrating chip antennas and electronic circuits on one and the same chip, substrate waves can transfer undesired signals to the electronic circuits and thus give rise to interference.

Various solutions for increasing the efficiency of chip antennas are known.

One approach is to thin the substrate to a specific thickness so that propagation of all wave modes up to mode TM0 is suppressed. This method works for GaAs as substrate material, but not for silicon substrates, due to the relatively low electrical impedance of silicon mentioned above, which causes corresponding signal losses.

Attempts have also been made to increase the electrical impedance of the silicon substrate near the antenna structure by means of proton implantation. However, this requires special technological equipment.

Removing the silicon under the conductor paths of the antenna structure with the aid of micromechanical technologies is known from the prior art. All that then supports the antenna structure is a thin membrane, which can easily break and cause the antenna to fall out.

One embodiment of a chip antenna which is accommodated along with a transceiver and a reflector in a semiconductor chip is described in patent specification U.S. Pat. No. 7,943,404. The emitter of the antenna is formed by structuring a metal level of a conductor path stack which is applied to the surface of the substrate during the "back end of line" (BEOL) stage of the production process. In order to improve the characteristics of the chip antenna, it is located in a region in which the electrical impedance of the substrate material has been increased by doping. To adapt the antenna to the desired frequency, the distance to a reflector located on the underside of the substrate is adjusted by thinning the substrate accordingly. Alternatively, or in combination with thinning, circular or elliptical trenches filled with a material having a lower dielectric constant may be located between the reflector and the emitter. This results in an average dielectric constant that is lower than that of the substrate. The disadvantage is that propagation of the waves along the surface of the substrate is not suppressed effectively, and that perforation of the substrate between the emitter and the reflector significantly reduces the mechanical stability of the chip.

SUMMARY OF THE INVENTION

According to one device aspect of the present invention, a chip antenna according to the invention comprises at least one emitter which extends parallel to a main surface of a semiconductor substrate supporting the chip antenna. The emitter is arranged on an island-like support zone of the semiconductor substrate, said support zone being surrounded by at least one trench which is completely filled with a gas, said trench passing through the entire depth of the semiconductor substrate and being bridged by at least one retaining web which forms a supporting connection between the support zone and the rest of the semiconductor substrate.

A key feature of the chip antenna of the present invention is firstly its mechanical robustness. In comparison with prior art solutions, this robustness allows signal losses to be reduced, and therefore allows a high level of efficiency to be achieved, efficiency being defined as the ratio of the net power radiated by the antenna to the sum of the net power and power loss of the antenna. The emitters of the antenna are each mounted on a zone of the substrate (support zone) which is separated from the rest of the substrate by one or more trenches and which is connected by one or more retaining webs to the rest of the substrate, the trenches passing through the entire depth of the substrate. There are no trenches under the emitters. By providing the island-like support zones, the signal losses of the antenna resulting from the conductivity of the substrate material are kept low. Lateral propagation of waves within the substrate is stopped efficaciously by the trenches. In embodiments described further below, signal losses can be further reduced on the basis of the inventive structure by designing the geometry of the support zone appropriately.

The inventive antenna also lends itself especially well to being produced with little complexity and expense in a standard CMOS or BiCMOS process. This will be described in detail further below with reference to preferred embodiments.

Embodiments of the inventive chip antenna shall now be described.

Different types of chip antenna may be used in different embodiments of the invention. In such different embodiments, the chip antenna is embodied, for example, as a monopole, dipole or as a multipole antenna. In different variants, the emitter is embodied in the form of an elongate strip, a helix, a serpentine or as a rectangular metal surface (patch), for example.

Many embodiments specify that a plurality of at least two emitters be provided, which are connected electrically conductively to each other.

In preferred embodiments, the emitter/emitters is/are arranged above the semiconductor substrate in a conductor path stack containing at least one metal level. The emitters in this embodiment can be formed at low cost by structuring one of the metal layers M1-M5 of the conductor path stack which are normally used for connecting microelectronic circuits.

It is preferred that the trench be produced by etching away the semiconductor substrate only. By etching away in such a selective manner, the conductor path stack is left free of etching. The substrate can be a silicon wafer, for example, whereas the conductor path stack and the metallic conductor paths mainly contain a dielectric, for example silicon oxide. With such a combination of materials, or similar, it is possible for the silicon in the substrate to be selectively etched.

Depending on the type of antenna, it is also possible for a plurality of levels, i.e., surfaces at different perpendicular distances from the main surface of the semiconductor substrate, to be used to form emitters and counterelectrodes. Thus, in such embodiments, either different emitters of the antenna, or the emitter and a counter electrode are each arranged at different levels in the same island-like isolated area.

In these embodiments, the aforementioned metal levels of a conductor path stack, for example, can be used as such different levels. In addition, or alternatively, at least a first one of the emitters is arranged on a front side of the semiconductor substrate and at least a second one of the emitters is arranged on an underside of the semiconductor substrate, in some embodiments. A counterelectrode can also be disposed additionally or alternatively on the underside. An electrical connection between such antenna elements provided on the front side and the underside can be realized by means of through-substrate vias (TSV).

In embodiments in which a microelectronic circuit is integrated in the semiconductor substrate, the front side is typically the side of the semiconductor substrate on which the microelectronic circuit and conductor path stack that interconnects the microelectronic so circuit elements is disposed. In some embodiments, specifically in those which do not have a microelectronic circuit in the semiconductor substrate, any of the substrate sides can be named as the front side and the underside.

In many embodiments, the chip antenna according to the invention comprises at least two emitters which are arranged on different island-like support zones and are connected electrically conductively to each other.

The signal losses of the antenna resulting from the conductivity of the substrate material are particularly low when only the support zone for supporting the emitters, and which is bounded by trenches, is adapted to approximately the shape of the emitters and is sufficiently small. In such embodiments, lateral propagation of waves within the semiconductor substrate is stopped particularly efficaciously by the trenches. The support zone in such embodiments preferably has a geometrical configuration such that, at each emitter edge point facing the surrounding trench, there is a short perpendicular distance to a trench edge facing the emitter. The smaller that distance, the less signal loss is caused by the substrate material (silicon, for example). On the other hand, it is necessary to take tolerance into account when producing the trench. If too small a distance is set, it may not be possible in some circumstances to reliably prevent a piece of the substrate material under the emitter from being etched away. This would alter the effective permittivity and interfere with the resonance frequency of the antenna. When tolerance is taken into account, said perpendicular distance should therefore preferably be between 50 and 300 microns, and particularly preferably between 100 and 150 microns.

In order to achieve sufficient attenuation and also a high level of mechanical stability for the chip antenna, the width of the trenches can be optimized. A wider trench provides better isolation than a narrow trench, but it requires a larger chip area and reduces mechanical stability. The trench surrounding the support zone has preferably a lateral extension (width) of 100 to 400 microns, and particularly preferably a width of 150 to 300 microns.

The mechanical stability is also affected by the design of the retaining web. Different geometrical designs are basically possible in this regard. In one preferred embodiment which is easily produced, the retaining web projects either approximately or exactly perpendicularly from the trench edge, not only on the support zone side but also on the side of the remaining semiconductor substrate.

The mechanical stability of the antenna and its resistance to vibrations is affected by the lateral width of the retaining webs for the support zone, which can be rigid in design. However, the width of the retaining web is also determined with regard to the distance between the two antenna dipoles, to the width of the trench and with regard to the distance between the trench edge and the emitter. The retaining web preferably has a lateral extension transverse to its longitudinal direction of between 50 and 150 microns, particularly preferably of between 80 and 120 microns.

An embodiment with a single retaining web is particularly simple and is particularly beneficial for minimizing the signal losses of the antenna. However, embodiments having a plurality of webs may make sense, for example in order to realize geometric shapes for connecting lines between a plurality of support zones, shapes that are advantageous in high-frequency technologies.

If a plurality of webs are used, these do not have to have the same width. A retaining web with a relatively large width and a connecting web with a relatively small width may be used. In other words, the function of ensuring the mechanical stability of the chip antenna may be assigned with different weightings to the different webs in such embodiments.

In another embodiment of the chip antenna, the semiconductor substrate is fixed by its underside to a circuit board. It may be fixed, in particular, to a grounding surface on the printed circuit board.

In order to optimize the high-frequency characteristics of the chip antenna, the semiconductor substrate has a predetermined thickness in preferred embodiments, which can be achieved in process engineering terms by controlled thinning of an initial substrate, such as a wafer in the form of a silicon wafer, for example. This embodiment is specifically important in the case where a reflector on the underside of the semiconductor substrate is used. To prevent destructive interference in such embodiments, the semiconductor substrate has a thickness in the depth direction, wherein a wave generated by the antenna and running in the substrate and reflected at the underside of the semiconductor substrate interferes constructively with a non-reflected wave generated by the antenna and running in the substrate. One advantage of this embodiment is that the field is twice as strong in the direction of the non-reflected wave.

Various materials can basically be used for the semiconductor substrate. The invention is particularly suitable for semiconductor substrates with relatively high conductivity, as is the case with silicon substrates, for example. Using a silicon substrate has the additional advantage that the chip antenna can be integrated with it in advanced production technologies such as CMOS or BiCMOS. The dimensions of the chip antenna may be small, due to the high permittivity of the silicon substrate. In alternative embodiments thereto, the semiconductor substrate is a silicon-germanium substrate, a gallium arsenide substrate, or a gallium nitride substrate, which should not be construed as meaning that other substrates are excluded from use.

In advantageous developments, in one of the embodiments described in the foregoing or further below, the chip antenna according to the invention is integrated in an electronic component which contains, in addition to such a chip antenna, at least one electronic circuit which is electrically connected to the chip antenna. In preferred embodiments, the electronic circuit is monolithically integrated in the semiconductor substrate. In this way, transmitter, receiver or transceiver chips with an integrated chip antenna for high-frequency radiation can be provided, which benefit from the advantages, described above, of the chip antenna according to the invention. However, advantageous developments of the invention can also be embodied as electronic components in the form of a system-in-package. In a system-in-package, the electronic circuit is arranged in a second semiconductor substrate which is connected as a system-in-package to the first semiconductor substrate in a common package. In some embodiments of this kind, the semiconductor substrate of the chip antenna does not have a monolithically integrated electronic circuit.

One aspect of the present invention relates to a method for producing a chip antenna, said method comprising the steps of producing an island-like support zone in a semiconductor substrate by fabricating at least one trench completely filled with gas, which surrounds the island-like isolated area, wherein the trench is formed through the entire depth of the semiconductor substrate and at least one retaining web bridging the trench is left, which forms a supporting connection between the island-like isolated area of the semiconductor substrate and the remaining area of the semiconductor substrate, producing the chip antenna with at least one emitter which extends, parallel to a main surface of the semiconductor substrate supporting the chip antenna in the island-like isolated area, wherein the trench is formed either before or after the chip antenna is produced.

The method according this second aspect of the invention shares the advantages of the chip antenna according to the first aspect of the invention. The trench can be formed, as already mentioned, either before or after the chip antenna is produced. However, etching is preferably carried out after all the other components have been produced, i.e., after the chip antenna has been produced.

In one preferred variant of the method, the trenches formed in the substrate are produced from the underside of the substrate by dry etching.

The semiconductor substrate is preferably thinned for use to a particular thickness and glued directly to the grounding surface of a printed circuit board.

In another variant, a metal layer is applied to the underside of the chip and is electrically connected to the top side by a via. The chip is thinned in such a way that the reflected wave interferes constructively with the non-reflected wave.

BRIEF DESCRIPTION OF THE DRAWINGS

Further embodiments shall now be described with reference to the Figures, in which:

FIG. 1 shows a schematic plan view of a chip antenna according to one embodiment of the invention;

FIG. 2 shows a schematic cross-sectional view of the chip antenna in FIG. 1 along line A-A;

DETAILED DESCRIPTION

Figure 3:
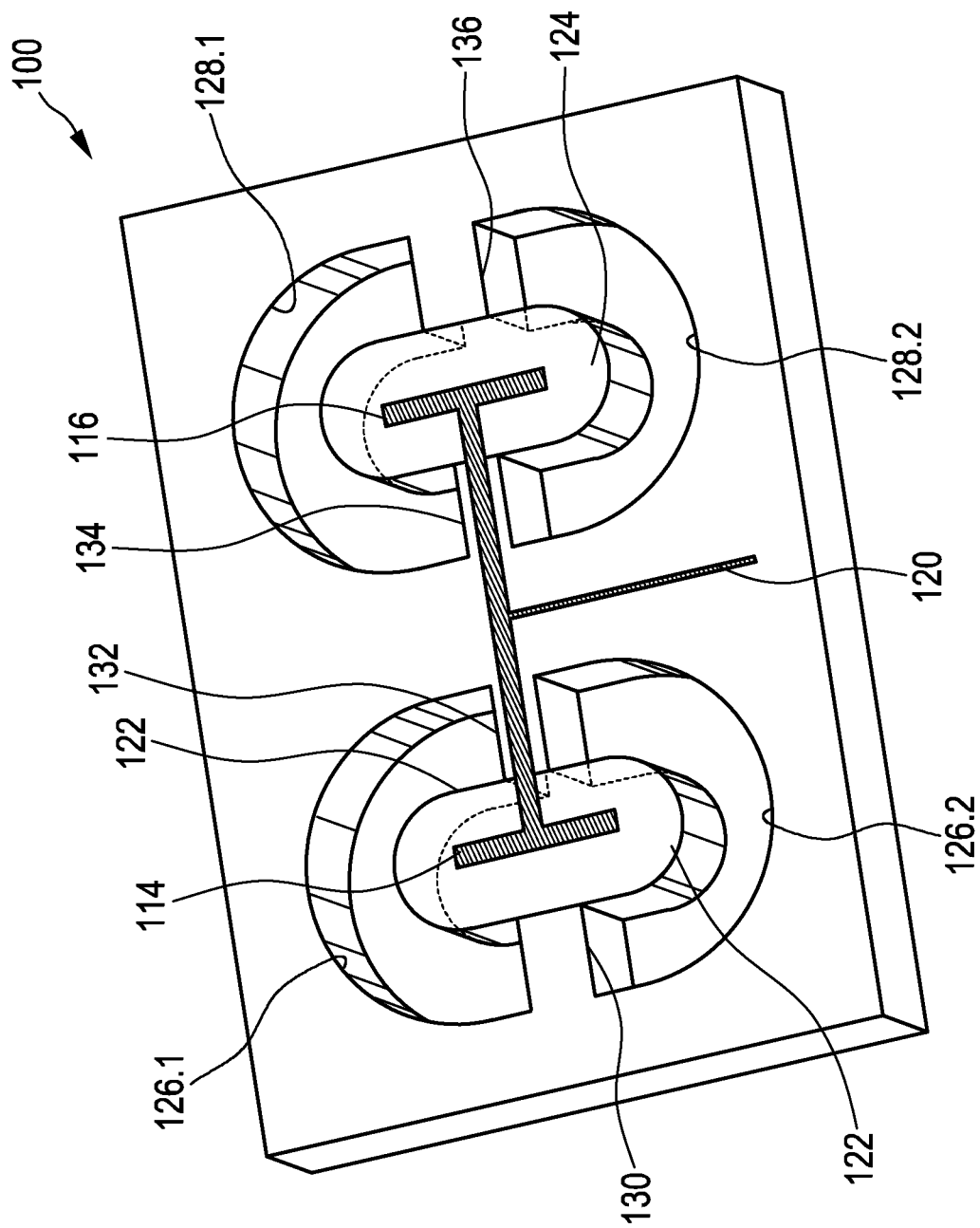
FIG. 3 shows a schematic perspective view of the chip antenna in FIGS. 1 and 2.

A first embodiment of a chip antenna 102 according to the present invention, integrated in an electronic component in the form of a chip 100, shall now be described with parallel reference to FIGS. 1 to 3. The views shown in FIGS. 1 to 3 are merely schematic. Each Figure shows only a lateral section of chip 100 containing chip antenna 102. Other lateral sections of chip 100, containing monolithically integrated electronic circuits, for example, are not shown in graphical form here for the sake of simplicity. In FIG. 3, some of the details drawn into the two views in FIGS. 1 and 2 have been left out. This is done solely for the purpose of clearer presentation.

Chip antenna 102 is formed on a semiconductor substrate, which is a silicon wafer 104 here. Silicon wafer 104 is a standard semiconductor substrate use in CMOS or BiCMOS processes.

Silicon wafer 104 is connected here by its underside 106 to a metallic reflector 108. The reflector can be a grounding surface of a printed circuit board, for example, to which chip 100 is securely glued by its underside 106. In an alternative embodiment not shown here, the reflector is a metal layer applied to the underside 106 of silicon wafer 104 by a deposition process. This metal layer can be electrically connected, by a via passing through the wafer, to the top side of the substrate and to the chip antenna 102 disposed there.

Chip antenna 102 is arranged on a top side of silicon wafer 104, namely on a second level M2 of conductor path stack 110. In this embodiment, conductor path level M2 forms the uppermost conductor path level of conductor path stack 110. There is only one more conductor path level arranged below it, namely the lowermost conductor path level M1. The two conductor path levels M1 and M2 are electrically insulated from each other by an interlevel dielectric (ILD) 112.

The chip antenna 102 on the second conductor path level M2 has two emitters 114 and 116. Emitters 114 and 116 are each realized as straight, rod-shaped conductor path sections. The two emitters 114 and 116 are connected electrically conductively to each other by an antenna web 118 which is likewise embodied as a metallic conductor path section. The two emitters 114 and 116 branch off from antenna web 118 in the middle of their longitudinal extension. Together with antenna web 118, the two emitters 114 and 116 thus form the shape of a capital letter H, i.e., the shape of a folded dipole. An antenna feeder 120 is schematically indicated in FIGS. 1 and 3.

In chip antenna 102, the first metallization level M1 of conductor path stack 110 forms a grounding level. However, no metal is provided on metallization level M1 below emitters 114 and 116.

In contrast to antenna web 118, the two emitters 114 and 116 are formed on island-like support zones 122 and 124 of semiconductor substrate 104. As can be seen particularly dearly in the cross-sectional view shown in FIG. 2 and in the perspective view shown in FIG. 3, the two support zones 122 and 124 are isolated from the rest of silicon wafer 104 by trenches 126 and 128. In chip 100 of the present embodiment, trenches 128 and 128 are filled with air. However, they can also be filled with some other gas or with a vacuum. Any filling of the trenches with a solid dielectric material, even partially, is excluded in the present invention.

The two support zones 122 and 124 are each coupled mechanically to the surrounding silicon wafer 104 by retaining webs 130, 132 and retaining webs 134 and 136, respectively. Connecting webs 130 to 134 divide each of the two trenches 126 and 128 into two trench portions 126.1, 126.2 and 128.1, 128.2, respectively. Apart from retaining webs 130 to 136, the two emitter 114 and 116 are completely surrounded by trenches 126 and 128. The trenches are typically about 150 to 300 microns in width. The support zones are adapted in their geometrical shape to the rod shape of emitters 114 and 116. In the present example, they are likewise approximately rod-shaped, but with rounded longitudinal ends. The distance between the emitters and the surrounding trenches is kept as small as process technology allows. It is typically in the range of 100 to 150 microns. In this way, the signal losses of the antenna can be reduced.

By giving the support zones rounded longitudinal ends, the distance from the trench edge to the edge of the dipole can advantageously be kept uniform throughout.

Retaining webs 130 to 136 ensure that support zones 122 and 124 thus formed are connected in a mechanically stable manner to silicon wafer 104. The width of retaining webs 132 and 134 is 100 microns, for example.

In the present embodiment, the outer retaining webs 130 and 136 are wider than the inner retaining webs 132 and 134. The two outer retaining webs 130 and 136 thus form the connection, important for mechanical stability, between the two support zones 122 and 124 and silicon wafer 104. The main purpose of the two inner connecting webs 132 and 134 is to provide an electrical connection between the two emitters 114 and 116 via antenna web 118 running over the two connecting webs 132 and 134. It is also possible within the scope of the present invention for at least one of the support zones to be connected to the surrounding substrate by only one retaining web.

Producing chip 100 involves normal steps of a CMOS or BiCMOS process, supplemented by producing the island-like support zones 122 and 124. This is done by forming trenches 126 and 128 by reactive ion etching, starting from the underside 106 of silicon wafer 104. This step is carried out, in the present embodiment, after producing conductor path stack 110 with the conductor path structures of chip antenna 102 as described above. This way of managing the process allows production of chip antenna 102 to be integrated in known CMOS or BiCMOS process as part of the back end process.

Figure 4:
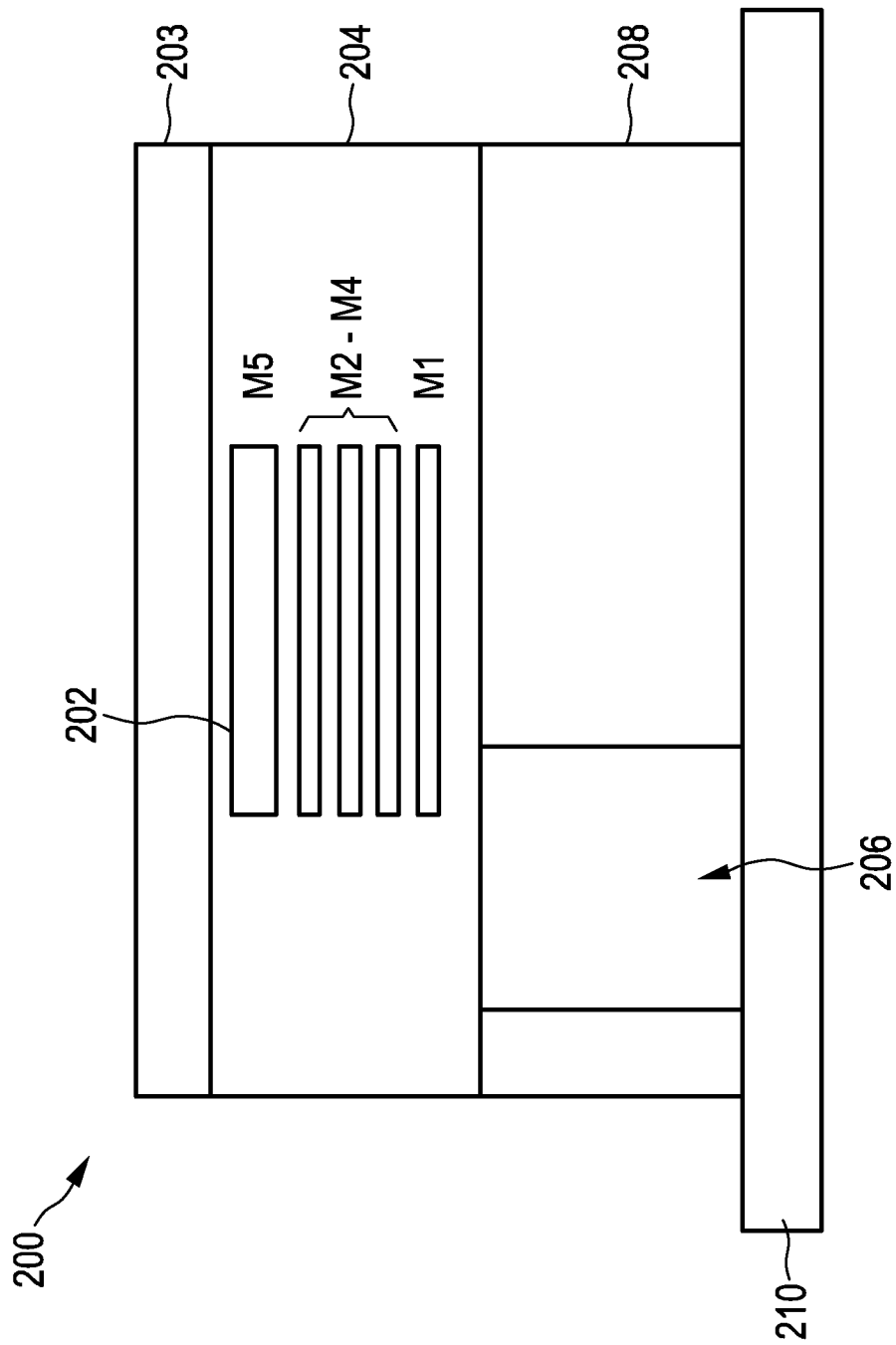
FIG. 4 shows a schematic cross-sectional view of another embodiment of a chip antenna according to the present invention.

FIG. 4 shows a schematic cross-sectional view of another embodiment of a chip antenna 202 on a chip 200. Many features of this embodiment are similar to those of the first embodiment shown in FIGS. 1 to 3. For that reason, FIG. 4 shows only a cross-sectional view of the embodiment corresponding to the cross-sectional view in FIG. 2. The following description mainly focuses on difference between the present embodiment and the first embodiment described in the foregoing.

In chip 200 according to the present embodiment, chip antenna 202 is formed on the topmost metal level M5 in a conductor path stack 204, which in this example has five metal layers M1 to M5, and it is covered by a passivation layer 203. Its shape is the same as the one shown in the first embodiment. In other words, the emitters and the antenna web are arranged on the fifth metal level M5, but this is not shown in any further detail in the simplified view in FIG. 4. Conductor path levels M2 to M4 contain conductor paths, in a manner known per se, for connecting electronic components of an electronic circuit (not shown) monolithically integrated in chip 200 and can also be used to connect the electronic components to the antenna. Conductor path level M1 forms a grounding level in the present example. Interlevel dielectrics (ILD) are disposed between metal layers M1 to M5, as is known from conductor path stack produced with conventional technologies.

In the present embodiment, a trench 206 extends from an underside of a silicon substrate 208 through the silicon substrate, but not into conductor path stack 204. The trench thus ends before or at the substrate-side end of the conductor path stack.

Silicon substrate 204 is fixed by its underside onto a reflector 210 which increases the efficiency of the chip antenna.

In another embodiment, the emitter is formed on a layer stack which is formed solely by dielectric material (not shown here). In this variant, conductor paths can be arranged laterally alongside said layer stack.

What is claimed is:

1. A chip antenna comprising at least one emitter which extends parallel to a main surface of a semiconductor substrate formed of a semiconductor material, said semiconductor substrate supporting the chip antenna,
   wherein the semiconductor substrate comprises at least one island-like support zone and at least one retaining web, and wherein the emitter is arranged on the island-like support zone of the semiconductor substrate,
   wherein the island-like support zone is formed by at least one trench which surrounds the island-like support zone and is completely filled with a gas, said support zone and trench passing through the entire depth of the semiconductor substrate,
   and wherein the at least one retaining web bridges between the at least one trench to form a supporting connection between the support zone and the rest of the semiconductor substrate.

2. The chip antenna according to claim 1, wherein the emitter is arranged above the semiconductor substrate in a conductor path stack containing at least one metal level.

3. The chip antenna according to claim 1, wherein different emitters of the antenna are each arranged at different levels in the same island-like isolated area.

4. The chip antenna according to claim 1, said chip antenna comprising at least two emitters which are arranged on different island-like support zones and are connected electrically conductively to each other.

5. The chip antenna according to claim 3, wherein at least a first one of the emitters is arranged on a front side of the semiconductor substrate and at least a second one of the emitters is arranged on an underside of the semiconductor substrate.

6. The chip antenna according to claim 1, wherein at each emitter edge point facing the surrounding trench there is a perpendicular distance of between 100 and 150 microns to a trench edge facing the emitter.

7. The chip antenna according to claim 1, wherein the trench has a lateral extension of between 150 and 300 microns.

8. The chip antenna according to claim 1, wherein the retaining web has a lateral extension transverse to its longitudinal direction of between 80 and 120 microns.

9. The chip antenna according to claim 1, wherein the semiconductor substrate is fixed by its underside to a circuit board.

10. The chip antenna according to claim 1, wherein the semiconductor substrate has a reflector on its underside and has a thickness in the depth direction, wherein a wave generated by the antenna and running in the substrate and reflected at the underside of the semiconductor substrate interferes constructively with a non-reflected wave generated by the antenna and running in the substrate.

11. The chip antenna according to claim 1, wherein the semiconductor substrate is a silicon substrate or a gallium arsenide substrate or an indium phosphide substrate or a gallium nitride substrate or a sapphire substrate or a glass substrate.

12. An electronic component, comprising a chip antenna according to claim 1 and at least one electronic circuit which is electrically connected to the chip antenna.

13. The electronic component according to claim 12, wherein the electronic circuit is monolithically integrated in the semiconductor substrate.

14. The electronic component according to claim 12, wherein the electronic circuit is arranged in a second semiconductor substrate connected as a system-in-package to the first semiconductor substrate in a common package.

15. A method for manufacturing a chip antenna with at least one emitter which extends parallel to a main surface of a semiconductor substrate formed of a semiconductor material, the method comprising the steps of
producing an island-like support zone in the semiconductor substrate by fabricating at least one retaining web and by fabricating at least one trench which surrounds the island-like support zone and which is completely filled with gas,
wherein the support zone and the trench pass through the entire depth of the semiconductor substrate and wherein the at least one retaining web bridges the trench to form a supporting connection between the support zone and the remaining area of the semiconductor substrate, and
producing the chip antenna with at least one emitter which extends parallel to a main surface of the semiconductor substrate supporting the chip antenna in the island-like support zone,
wherein the trench is formed either before or after the chip antenna is produced.

* * * * *